United States Patent [19]

Vu et al.

[11] Patent Number: 6,140,832
[45] Date of Patent: Oct. 31, 2000

[54] METHOD OF UTILIZING IDDQ TESTS TO SCREEN OUT DEFECTIVE PARTS

[75] Inventors: Truc Q. Vu, Tustin; Emad S. Zawaideh, Encinitas; Nhan T. Do, Irvine; Glenn M. Kramer, Vista, all of Calif.

[73] Assignee: Raytheon Company, Lexington, Mass.

[21] Appl. No.: 09/092,387

[22] Filed: Jun. 5, 1998

[51] Int. Cl.[7] .......................... G01R 31/26; G01R 31/02; G01R 1/04; G06F 11/00
[52] U.S. Cl. ...................... 324/765; 324/158.1; 324/763; 714/740
[58] Field of Search .................................. 324/765, 763, 324/158.1; 714/738, 740, 745

[56] References Cited

U.S. PATENT DOCUMENTS

| 5,294,883 | 3/1994 | Akiki et al. .............................. 324/765 |
| 5,332,973 | 7/1994 | Brown et al. .......................... 324/158.1 |
| 5,371,457 | 12/1994 | Lipp ....................................... 324/158.1 |
| 5,483,170 | 1/1996 | Beasley et al. .......................... 324/765 |
| 5,554,941 | 9/1996 | Kesel ....................................... 324/765 |
| 5,670,892 | 9/1997 | Sporck ..................................... 324/765 |
| 5,712,857 | 1/1998 | Whitman et al. ........................ 324/765 |
| 5,731,700 | 3/1998 | McDonald ........................... 324/158.1 |
| 5,757,203 | 5/1998 | Brown ................................... 324/158.1 |
| 5,869,977 | 2/1999 | Kalb, Jr. et al. ...................... 324/158.1 |

*Primary Examiner*—Safet Metjahic
*Assistant Examiner*—Jermele Hollington
*Attorney, Agent, or Firm*—Leonard A. Alkov; William C. Schubert; Glenn H. Lenzen, Jr.

[57] ABSTRACT

A method that uses effective widths of NMOS and PMOS devices in a digital circuit and their intrinsic junction and subthreshold leakage currents to produce a specification for IDDQ, the range of IDDQ, and the delta of IDDQ between pre- and post-overvoltage stress tests to screen out defective integrated circuits having excessive extrinsic current leakage. The present invention provides for a computer-implemented method that generates an indication of whether IDDQ values associated with integrated circuits that have been tested are within the IDDQ specification or not. This processing eliminates the need for time-intensive and costly burn-in testing on the integrated circuits.

2 Claims, 4 Drawing Sheets

Table 1: IDDQ Process Limits

| ASIC | Total | | IDDQ,Lo −1sigma | IDDQ,Hi +1sigma | IDDQ,Lo −2sigma | IDDQ,Hi +2sigma | IDDQ mean | Process Limit (+10%forAW+10%Unc.) | | | |
|---|---|---|---|---|---|---|---|---|---|---|---|
| | NMOS | PMOS | | | | | | IDDQ | Range | Delta(−) | Delta(+) |
| RSUM 2214 | 2.22E+05 | 4.16E+05 | 4.15E-06 | 1.93E-05 | 2.22E-06 | 6.79E-05 | 8.06E-06 | 7.47E-05 | 2.24E-05 | -1.49E-05 | 2.00E-05 |
| CAL 2362 | 8.26E+05 | 7.46E+05 | 8.38E-05 | 3.64E-05 | 4.73E-06 | 1.25E-04 | 1.58E-05 | 1.38E-04 | 4.14E-05 | -2.76E-05 | 2.00E-05 |
| RBW 2367 | 1.29E+06 | 1.17E+06 | 1.32E-05 | 5.74E-05 | 7.44E-06 | 1.97E-04 | 2.49E-05 | 2.17E-04 | 6.52E-05 | -4.34E-05 | 2.00E-05 |
| GRWT 2369 | 1.50E+06 | 1.24E+06 | 1.42E-05 | 6.11E-05 | 8.09E-06 | 2.10E-04 | 2.68E-05 | 2.30E-04 | 6.91E-05 | -4.61E-05 | 2.00E-05 |
| GFWT 2355 | 1.07E+06 | 1.30E+06 | 1.38E-05 | 6.20E-05 | 7.61E-06 | 2.16E-04 | 2.64E-05 | 2.37E-04 | 7.12E-05 | -4.74E-05 | 2.00E-05 |
| GRRO 2368 | 1.51E+06 | 1.28E+06 | 1.46E-05 | 6.31E-05 | 8.31E-06 | 2.17E-04 | 2.76E-05 | 2.38E-04 | 7.15E-05 | -4.77E-05 | 2.00E-05 |
| GCUF 2358 | 1.35E+06 | 1.30E+06 | 1.44E-05 | 6.30E-05 | 8.09E-06 | 2.17E-04 | 2.73E-05 | 2.39E-04 | 7.17E-05 | -4.78E-05 | 2.00E-05 |
| FWT 2361 | 1.43E+06 | 1.42E+06 | 1.56E-05 | 6.86E-05 | 8.75E-06 | 2.37E-04 | 2.96E-05 | 2.61E-04 | 7.82E-05 | -5.21E-05 | 2.00E-05 |
| GFRO 2357 | 1.64E+06 | 1.59E+06 | 1.76E-05 | 7.71E-05 | 9.87E-06 | 2.66E-04 | 3.34E-05 | 2.93E-04 | 8.78E-05 | -5.85E-05 | 2.00E-05 |
| DIST 2363 | 1.63E+06 | 1.63E+06 | 1.79E-05 | 7.87E-05 | 1.00E-05 | 2.72E-04 | 3.40E-05 | 2.99E-04 | 8.97E-05 | -5.98E-05 | 2.00E-05 |
| RWT 2365 | 1.62E+06 | 1.80E+06 | 1.94E-05 | 8.63E-05 | 1.08E-05 | 2.99E-04 | 3.70E-05 | 3.29E-04 | 9.87E-05 | -6.58E-05 | 2.00E-05 |
| FIFFT 2360 | 1.51E+06 | 1.90E+06 | 2.01E-05 | 9.04E-05 | 1.10E-05 | 3.15E-04 | 3.85E-05 | 3.46E-04 | 1.04E-04 | -6.93E-05 | 2.00E-05 |
| FBW 2359 | 1.96E+06 | 2.05E+06 | 2.23E-05 | 9.88E-05 | 1.25E-05 | 3.42E-04 | 4.25E-05 | 3.76E-04 | 1.13E-04 | -7.52E-05 | 2.00E-05 |
| RFFT 2366 | 1.48E+06 | 2.10E+06 | 2.18E-05 | 9.91E-05 | 1.19E-05 | 3.46E-04 | 4.19E-05 | 3.81E-04 | 1.14E-04 | -7.62E-05 | 2.00E-05 |
| GFFT 2356 | 1.53E+06 | 2.16E+06 | 2.24E-05 | 1.02E-04 | 1.22E-05 | 3.56E-04 | 4.31E-05 | 3.92E-04 | 1.18E-04 | -7.83E-05 | 2.00E-05 |
| DMM 2364 | 1.28E+06 | 2.34E+06 | 2.34E-05 | 1.09E-04 | 1.25E-05 | 3.82E-04 | 4.54E-05 | 4.20E-04 | 1.26E-04 | -8.40E-05 | 2.00E-05 |

METHOD OF UTILIZING IDDQ TESTS TO SCREEN OUT DEFECTIVE PARTS

BACKGROUND

The present invention relates generally to integrated circuit device screening methods, and more particularly, to a method that uses IDDQ testing to screen out defective integrated circuit devices.

Heretofore, IDDQ data have been analyzed using statistical techniques to evaluate whether integrated circuit devices are defective. Using such conventional techniques, those integrated circuit devices in a process lot that follow a normal distribution are considered good devices while those that do not are thrown out. This technique is not effective in screening out defective devices if the population is not normally distributed due to the single wafer processing characteristic of a process. Furthermore, the normally distributed population can also contain defective devices since no correlation exists between the device physics and the IDDQ specification.

This technique becomes less and less effective when the complexity of the integrated circuit devices is high. The IDDQ component derived from intrinsic device leakage (NMOS and PMOS transistors) is higher than the current derived from defects such as gate oxide leakage, polysilicon and barrier metal bridging. When the defective current is smaller than the intrinsic current, the statistical technique cannot detect the smaller current component. This leads to the situation where either defective devices are allowed to pass, thus compromising the reliability of the products, or good devices are screened out, which adds to the cost of the products.

Accordingly, it is an objective of the present invention to provide for an improved computer-implemented method that uses IDDQ testing to screen out defective integrated circuit devices.

SUMMARY OF THE INVENTION

To accomplish the above and other objectives, the present invention provides for a method that uses effective widths of NMOS and PMOS devices in a digital circuit and their intrinsic junction and subthreshold leakage currents to produce a specification for IDDQ, the range of IDDQ, and the delta of IDDQ between pre- and post-overvoltage stress tests to screen out defective integrated circuits having excessive extrinsic current leakage. The present invention provides for a computer-implemented method that generates an indication of whether IDDQ values associated with integrated circuits that have been tested are within the IDDQ specification or not.

The IDDQ test and overvoltage stresses have heretofore been used for the purpose of screening out defective digital integrated circuits. However, these techniques, when used in accordance with the principles of the present invention, allow an integrated circuit manufacturer to eliminate other costly screening methods such as burn-in tests. For high leakage processes and for high complexity circuits, the intrinsic IDDQ levels are very high compared to the level of current caused by defects, such as from single gate oxide leakage, polysilicon and barrier metal bridging, for example. The IDDQ test in these cases is not effective at all if the intrinsic current cannot be separated out. The purpose of the present invention is to provide a way to effectively utilize the IDDQ test to screen out defective parts for these cases and extend the usefulness of this technique to ultra large scale integration integrated circuits.

More specifically, the present method includes the following steps. A parametric test is performed on kerf test structures formed on each integrated circuit chip on a wafer using an semiconductor parametric tester. The tester loads parametric test data derived from the test into a database. Pre-stress and post-stress functional tests are then performed on the integrated circuits using an integrated circuit tester and this data is also loaded into the database. A computer (software) program implemented in accordance with the present invention then processes the data stored in the database. The computer program extracts selected data derived from the IDDQ functional tests, and also computes minimum and maximum current leakage limits for the integrated circuits based upon the parametric test. The computer program then compares the current leakage limits with the test data extracted from the functional tests for both the pre-stress and post-stress functional tests and generates a pass/fail report for each of the integrated circuits. The pass/fail report indicates whether each integrated circuit is within the specification. The integrated circuits are thus accepted as good parts or rejected as bad parts based upon the processing performed by the computer program on the test data. This processing eliminates the need for time-intensive and costly burn-in testing on the integrated circuits to determine if they are good or not.

BRIEF DESCRIPTION OF THE DRAWINGS

The various features and advantages of the present invention may be more readily understood with reference to the following detailed description taken in conjunction with the accompanying drawing figures, wherein like reference numerals designate like structural elements, and in which:

FIG. 4 is a table of IDDQ process limits.

DETAILED DESCRIPTION

Figure 1:
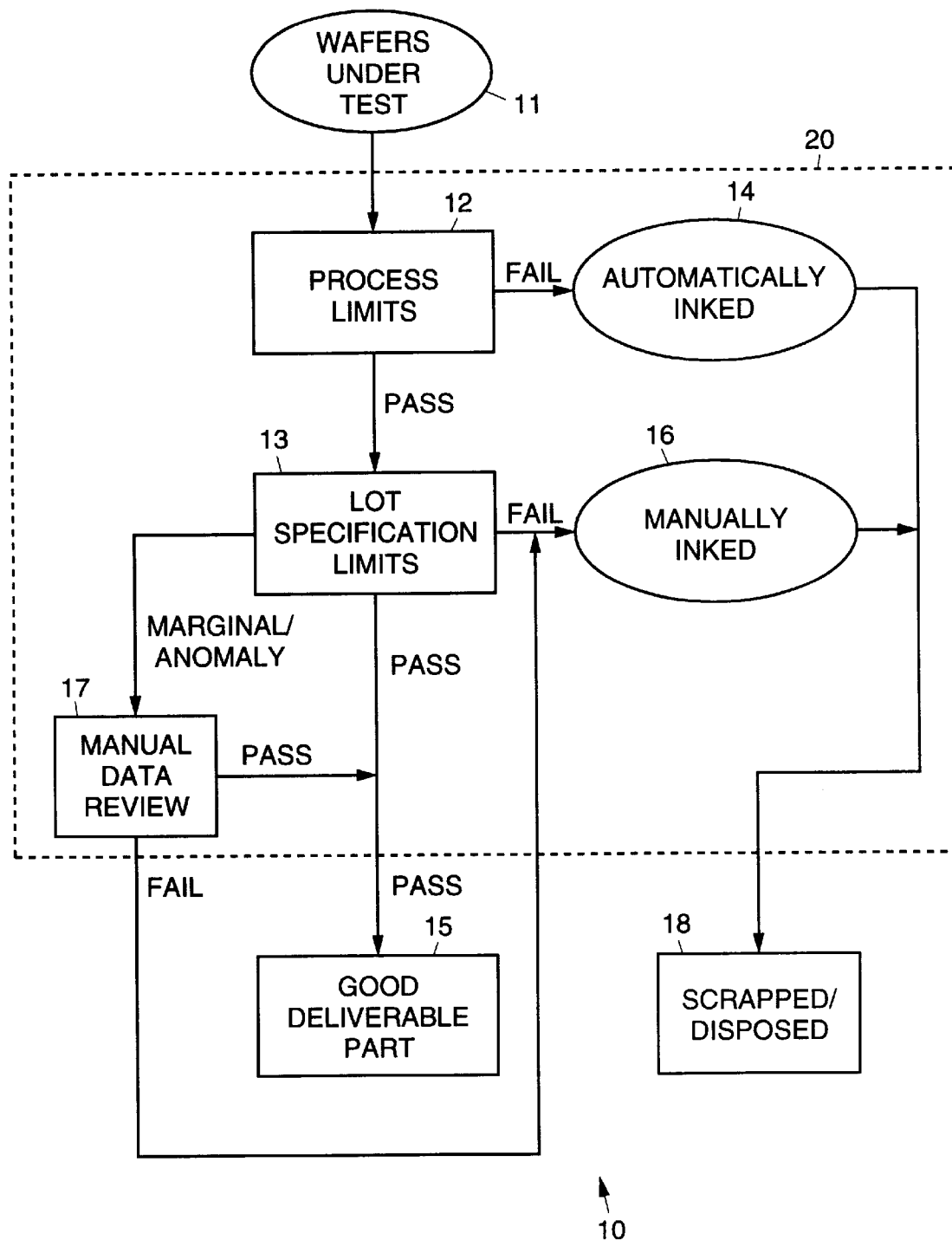
FIG. 1 is a flow chart illustrating an exemplary method in accordance with the principles of the present invention for using IDDQ testing to screen out defective integrated circuits.

Referring to the drawing figure, it illustrates an exemplary method 10 in accordance with the principles of the present invention for using IDDQ testing to screen out defective integrated circuit devices. In general, in the present method 10, wafers are tested 11 using a parametric and an integrated circuit tester. The parametric tester is used to perform a parametric test and the integrated circuit tester is used to perform pre- and post-overvoltage stress tests (discussed in more detail with reference to FIG. 2).

A computer (software) program 20 is used to determine process limits 12 by processing the data generated in the tests. In particular, test data associated with each integrated circuit is compared to the process limits 12 to determine if it passes of fails. If the data indicate that the integrated circuit fails, the integrated circuit is automatically inked to indicate this. The process limit 12 was determined for each circuit and inputted to the test program to perform the pass/fail function on the tester. If the data indicate that the integrated circuit passes, the data is compared 13 with lot specification limits.

The data for each passing integrated circuit is compared 13 to the lot specification limits. If it fails, the integrated circuit is manually inked to indicate that it failed. If it passes, a report is generated indicating this. If it is determined that a particular integrated circuit is marginal or has an anomaly, the data for this integrated circuit is manually reviewed. If the manual review indicates that the questionable integrated circuit passes, a report is generated indicating this. However, if the manual review indicates that the questionable integrated circuit fails, then the integrated circuit is manually inked to indicate that it failed. The computer program 20 outputs a pass/fail report for each integrated circuit that is tested. Each failed integrated circuit is scrapped 18 or otherwise disposed of.

Figure 2:
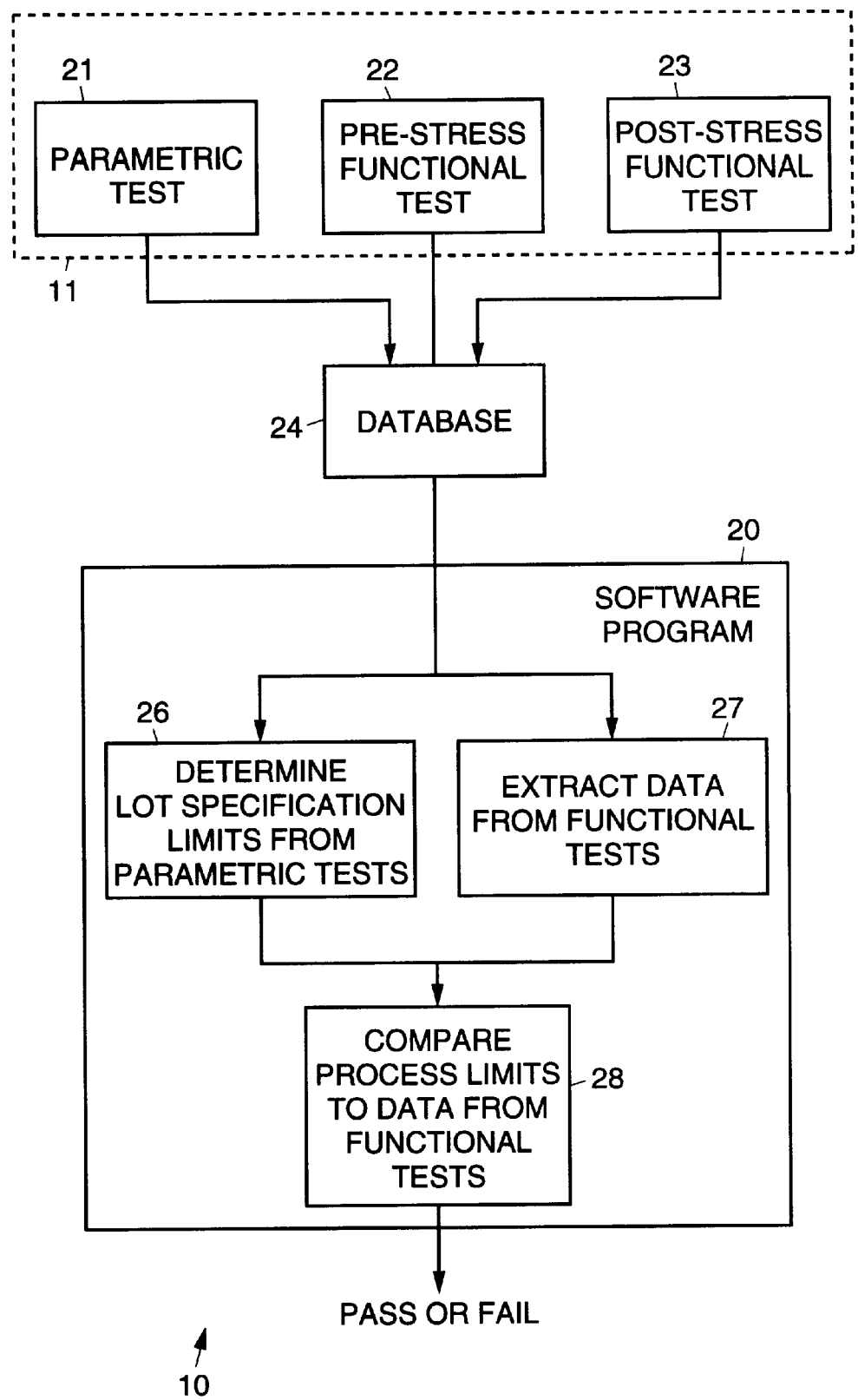
FIG. 2 illustrates details of the method of FIG. 1.

FIG. 2 illustrates additional details of the method 10 of FIG. 1. The computer program 20 processes the data generated in the tests to generate a specification for IDDQ, the range of IDDQ values, and the delta (difference) of IDDQ values between pre- and post-overvoltage stress tests and also generate a pass/fail report for each integrated circuit in the wafers. The pass/fail report indicates whether each integrated circuit is within the specification. The integrated circuits are accepted as good parts or rejected as bad parts based upon the processing performed by the computer program on the test data.

More specifically, the parametric test 21 is performed on a kerf test structure formed next to an integrated circuit chip using the parametric tester. The parametric tester loads parametric test data derived from the test into a database 24. The pre-stress and post-stress functional tests 22, 23 are then performed on the integrated circuit using the integrated circuit tester, and this data is also loaded into the database 24. The integrated circuit tester uses a functional test program that passes only circuits that have IDDQ lower than a predetermined process limit 12. The computer program 20 implemented in accordance with the present invention then processes the data stored in the database 24.

The computer program 20 determines 26 the lot specification limits 13 which are minimum and maximum current leakage limits for the integrated circuit based upon data derived from the parametric test 21 for that particular lot. The computer program 20 extracts 27 data derived from the IDDQ functional tests 22, 23. The computer program 20 then compares 28 the current leakage limits with the test data extracted from the pre-stress and post-stress functional tests 22, 23 and generates the pass/fail report for the integrated circuits.

The IDDQ test measures the static current of a digital IC when all the logic gates are in a known state. For CMOS logic, all paths between VDD and ground are connected by a pair of PMOS and NMOS devices (that form an inverter). This allows only one transistor to turn on at any given time in a static mode. The transistor in the off condition of such an inverter contributes its leakage current to the IDDQ measurement. The leakage current of the transistor comes from either junction leakage or subthreshold current of a low threshold device and is readily detectable for every die, wafer, and lot by measuring the test device in a kerf structure.

The measured transistor leakage current is input to the computer program 20 (which may be either part of a simulator or a model) to predict the intrinsic IDDQ for that die, wafer, or lot. Presently available commercial design simulators are not cable of computing the IDDQ current. However, the computer program 20 of the present invention may be implemented in future design simulators or computer aid design (CAD) tools to provide a fully integrated design process.

The most accurate IDDQ calculation is to implement, inside a CAD design tool, the count of all the off-state transistors after an IDDQ vector is exercised upon an integrated circuit. As mentioned above, existing CAD design tools do not have this feature. One method that was developed to calculate the IDDQ with very good accuracy is discussed below and is implemented in the computer program 20.

First, all NMOS and PMOS transistors in a design are counted using standard layout versus schematic (LVS) tools to arrive at a total width of NMOS and PMOS transistors. Transistors that do not contribute to IDDQ are counted and are subtracted from the count of all transistors to arrive at an effective width of NMOS and PMOS transistors. Examples of devices that are counted, at least in part, as noncontributing devices are as follows: stack transistors are counted as having ½ the width of the narrower transistor, (b) transmission gates connecting to a CMOS gate terminal have no junction or subthreshold leakage. For example, the total effective widths are listed in columns "Total" in Table 1 of FIG. 4 for NMOS and PMOS transistors for some of the circuits.

Then, the IDDQ is calculated as ½ the sum of the product of leakage current per unit of width and the total effective width of each type of transistor (NMOS and PMOS). The factor ½ is an estimate that at any time half the transistors are in the off-state and thus contribute to IDDQ. Often times, different vectors of IDDQ are used to measure a different combination of transistors at on and off states. The range of all these vectors has been found to be linearly correlated to the IDDQ value and can be specified as a percentage of IDDQ.

After the IDDQ test, the devices are subjected to overvoltage stress where the supply voltage is increased to a higher value than is used during a use condition. After the overvoltage stress test, the IDDQ vectors are measured again and the delta of IDDQ between the pre-stress and post-stress tests is determined as follows. If the delta is positive, a fixed value for the specification is used. A statistical technique may be used to set up this specification. If the delta is negative, charge trapping in the device is the cause and the value for this specification can be determined in a manner similar to the case of range.

The present method 10 works well for integrated circuits having 150K gate complexity. For integrated circuits having a complexity larger than millions of gates, it is more difficult to precisely calculate the IDDQ using the above-mentioned procedure. In this case, the procedure can be expanded to include the IDDQ measurement at different supply voltages and different temperatures. Since the intrinsic transistor leakage is a well behaved function of voltage and temperature, the added information further discriminates between the good and defective integrated circuits.

Further details regarding implementation of the present method 10 are given below. As an example that is applicable to a specific process, the process limits 12 given in Table 1 are used in the functional test program in the integrated circuit tester to pre-screen defective parts. The following exemplary criteria may be met to pass good parts (referred to as process limit pre-screening): measured IDDQ$\leq$IDDQ, measured Range of IDDQ$\leq$Range of IDDQ, measured Delta (+) of IDDQ$\leq$20 $\mu$A, and measured Delta (-) of IDDQ$\geq$Delta (-). Parts that passed these limits 12 are considered good. Parts that fail these limits are manually inked and are scrapped or are disposed of. Parts that are considered anomalous or marginal are subjected to manual data review. Parts that are not acceptable are manually inked and are scrapped or are disposed of.

Calculation of the IDDQ process limits 12 is discussed below and involves the following steps.

(A) The total effective width of all the circuits is calculated as follows. The total width of all NMOS and PMOS elements are counted using standard layout versus schematic (LVS) tools. Numbers of transistors that do not contribute to IDDQ are counted and are subtracted from total width calculation. These devices include stack transistors which are counted as having ½ the width of the narrow transistor, and transmission gate going into a CMOS gate terminal which contributes no leakage. The total effective widths are listed in column "Total" in Table 1 for both NMOS and PMOS transistors.

(B) The IDDQ limit is calculated using the equation:

$$IDDQ=(1/50)(Ileakpmos*WPMOS+Ileaknmos*WNMOS),$$

where WPMOS and WNTMOS are total effective widths of PMOS and NMOS, respectively, calculated in (A), Ileakpmos and Ileaknmos are leakage currents from PMOS and NMOS, respectively, calculated from the log mean value plus 2 log sigma deviation of the leakage current from the process with all acceptable process variations. The factor 1/50 comes from ½ of 1/25 $\mu$m, a normalizing factor for the width of the 25 $\mu$m wide devices used in the parametric test.

(C) The process limit IDDQ is established from (B) plus an additional 10% accounting for the uncertainty in test equipment.

(D) The Range of IDDQ is defined to be a percentage (30%, for example) of IDDQ (in C) due to a linear correlation between the two values: Range of IDDQ=0.3*IDDQ.

(E) If the Delta of IDDQ is positive, Delta is defined as: Delta (+)=10 $\mu$A, or other selected appropriate value.

(F) If the Delta of IDDQ is negative, specification limit is defined as: Delta (−)=−0.2*IDDQ.

Process limits 12 for IDDQ, Range of IDDQ, Delta(+), and Delta(−) are listed in the last four columns of Table 1.

Parts that pass the process limit pre-screening are subjected to lot specification limit screening. The lot specification limits in are tighter than those used in prescreening, and therefore bad parts, anomalous parts, and parts at the good/bad margin are further screened out at this stage.

The computer program 20 is then used to automate the screening of parts that passed using the lot specification limits. The Pass/Fail report is automatically generated. The following criteria must be met for good parts: measured IDDQ$\leq$IDDQ, measured Range of IDDQ$\leq$Range of IDDQ, measured Delta (+) of IDDQ$\leq$10 $\mu$A, and measured Delta (−) of IDDQ$\geq$Delta (−).

Parts that passed these limits are considered good. Parts that failed these limits are manually inked and scrapped/disposed. Parts that are considered anomalous or marginal are subjected to manual data review. Parts that fail are manually inked and scrapped or are disposed of.

The calculations of test limits for IDDQ, range of IDDQ, and Delta of IDDQ between pre- and post- overvoltage stress test 22, 23 implemented in the present method 10 will now be discussed. Data from the parametric test 21 for each lot is used to set up the lot specification limits. The calculation of lot specification limits is given below. The same values of W-NMOS and W-PMOS used in determining the process limits 12 for each circuit are used in the following equation for IDDQ:

$$IDDQ=(1/50)(Ip*WPMOS+In*WNMOS),$$

where WPMOS and WNMOS are the total effective widths of PMOS and NMOS, respectively, f=1.1 accounting for a 10% positive increase in W ($\Delta$W) in a SOS transistor, Ip and In are leakage currents in PMOS and NMOS (W/L=25/L$_{minimum}$), respectively. Ip and In are chosen from leakage current data from the lot being tested given by: Log mean value +2 log sigma deviation.

The range of IDDQ is defined to be a percentage (such as 30%, for example) of IDDQ due to a linear correlation between the two values and is given by: Range of IDDQ= 0.3*IDDQ. If the delta of IDDQ is positive, delta is defined as: Delta (+)=10 $\mu$A. If the delta of IDDQ is negative, the specification limit is defined as: Delta (−)=0.2*IDDQ.

Figure 3:
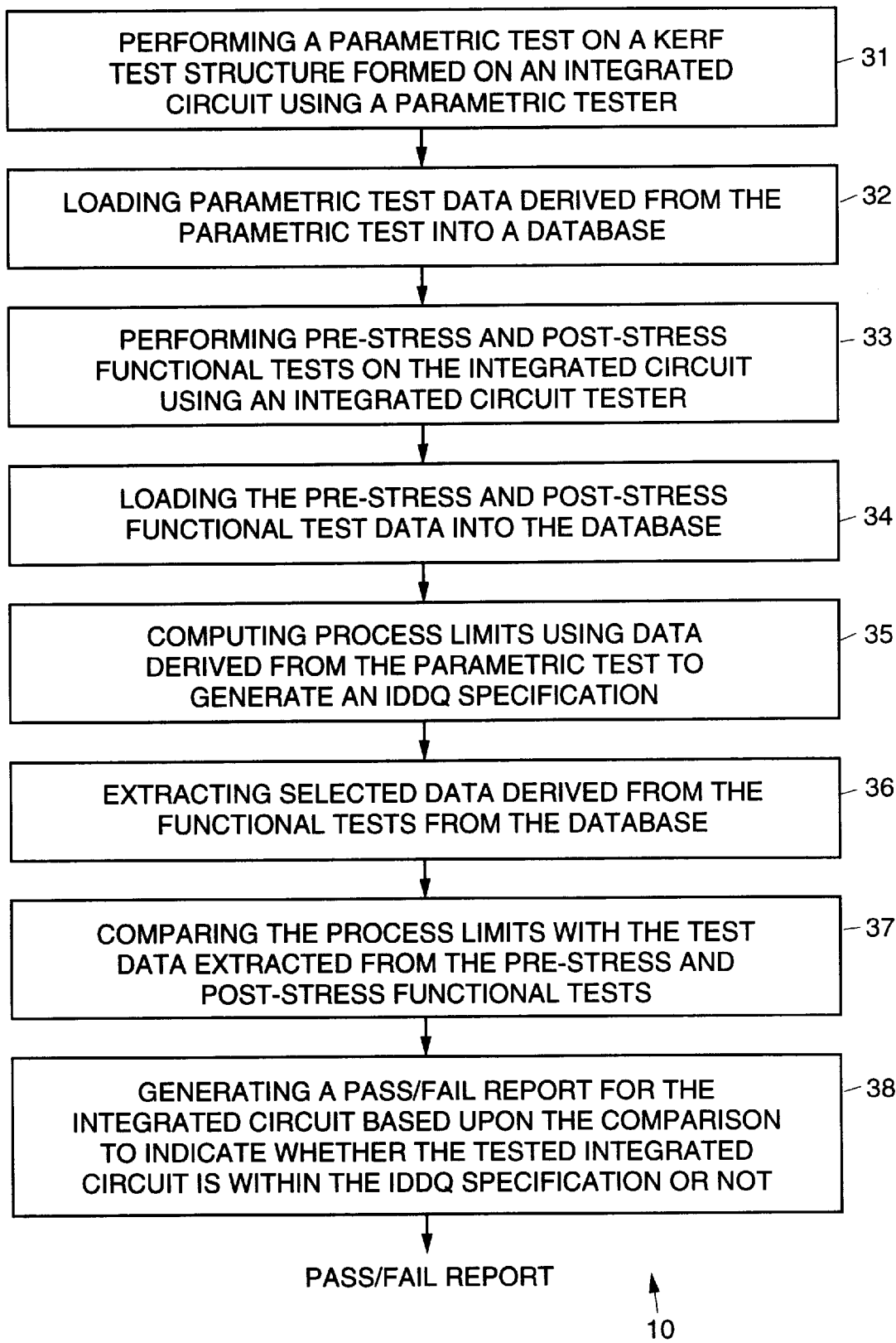
FIG. 3 is a flow diagram illustrating further details of the method of FIG. 1.

For the purposes of completeness, FIG. 3 is a flow diagram illustrating further details of the method 10 of FIG. 1. The method steps are as follows. A parametric test 21 is performed 31 on a test circuit of an integrated circuit chip using an integrated circuit tester. Parametric test data derived from the test is loaded 32 into a database 24. Pre-stress and post-stress functional tests 22, 23 are performed 33 on the integrated circuit using the tester. The pre-stress and post-stress functional test data are loaded 34 into the database 24. Process limits 12 are computed 35 using data derived from the parametric test 21 to generate an IDDQ specification. Selected data derived from the functional tests is extracted 36 from the database 24. The process limits 12 are compared 37 with the test data (current leakage limits) extracted from the pre-stress and post-stress functional tests. A pass/fail report is generated 38 for the integrated circuit based upon the comparison to indicate whether the tested integrated circuit is within the IDDQ specification or not.

Thus, a method of using IDDQ tests to screen out defective integrated circuit devices has been disclosed. It is to be understood that the described embodiments are merely illustrative of some of the many specific embodiments that represent applications of the principles of the present invention. Clearly, numerous and other arrangements can be readily devised by those skilled in the art without departing from the scope of the invention.

What is claimed is:

1. A method of using IDDQ tests to screen out defective integrated circuits, said method comprising the steps of:

performing a parametric test on a test structure formed on an integrated circuit using an parametric circuit tester;

loading parametric test data derived from the parametric test into a database;

performing pre-stress and post-stress overvoltage functional tests on the integrated circuit using an integrated circuit tester;

loading the pre-stress and post-stress overvoltage functional test data into the database:

computing process limits using data derived from the parametric test to generate an IDDQ specification;

extracting selected data derived from the functional tests from the database;

comparing the process limits with the test data extracted from the pre-stress and post-stress overvoltage functional tests; and generating a pass/fail report for the integrated circuit based upon the comparison to indicate whether the tested integrated circuit is within the IDDQ specification or not.

2. The method of claim 1 wherein the step of computing process limits to generate the IDDQ specification comprises the steps of:

generating a specification for IDDQ;

generating a range of IDDQ values;

generating the delta of IDDQ values between the pre-stress and post-stress overvoltage functional tests; and generating a pass/fail report for each integrated circuit in the wafers indicating whether the integrated circuit is within the specification.

* * * * *